United States Patent [19]

Heinecke

[11] 4,027,322

[45] May 31, 1977

[54] ZERO POINT SWITCHING THYRISTOR HAVING AN ISOLATED EMITTER REGION

[75] Inventor: Rudolf A. H. Heinecke, Harlow, England

[73] Assignee: ITT Industries, Inc., New York, N.Y.

[22] Filed: Oct. 21, 1975

[21] Appl. No.: 624,506

[30] Foreign Application Priority Data

Feb. 4, 1975 United Kingdom ............. 04712/75

[52] U.S. Cl. .................................. 357/38; 357/37; 357/68; 357/49; 357/55; 357/76; 357/17; 307/305

[51] Int. Cl.² .................. H01L 29/74; H01L 23/48; H01L 29/44; H01L 29/52

[58] Field of Search .................. 357/37, 38, 39, 68, 357/86, 49, 55, 76, 17; 307/305

[56] References Cited

UNITED STATES PATENTS

| | | | |
|---|---|---|---|
| 3,364,440 | 1/1968 | Schreiner | 357/55 |
| 3,434,022 | 3/1969 | Byrd | 307/305 |
| 3,566,211 | 2/1971 | Svedberg | 357/38 |
| 3,641,404 | 2/1972 | Svedberg | 357/38 |
| 3,708,732 | 1/1973 | Faust | 357/38 |
| 3,727,116 | 4/1973 | Thomas et al. | 357/38 |
| 3,914,782 | 10/1975 | Nakata | 357/68 |
| 3,914,783 | 10/1975 | Terasawa | 357/38 |
| 3,938,173 | 2/1976 | Jackson et al. | 357/38 |
| 3,967,308 | 6/1976 | Yatsuo et al. | 357/86 |

*Primary Examiner*—Andrew J. James
*Attorney, Agent, or Firm*—John T. O'Halloran; Peter C. Van Der Sluys; Vincent B. Ingrassia

[57] ABSTRACT

A conventional construction thyristor is modified to remove the short from the shorted emitter which is then led out to a separate pin for external connection. This enables the use of a simpler zero voltage switching control circuit.

5 Claims, 4 Drawing Figures

ZERO POINT SWITCHING THYRISTOR HAVING AN ISOLATED EMITTER REGION

BACKGROUND OF THE INVENTION

This invention relates generally to solid state switch devices and, more particularly, to a modified thyristor device having isolated emitter regions to facilitate zero voltage switching.

Zero voltage switching of a solid state switch such as a thyristor is usually effected via a trigger circuit connected between the input and output of the device. The trigger circuit is responsive to the voltage across the device and triggers the device when this voltage passes through zero. This mode of operation is preferred as it produces very little radio frequency interference, but it generally involves a comparatively large number of components and limits the use of the arrangement to this particular mode of operation as the associated components are normally intergrated with the tyristors.

SUMMARY OF THE INVENTION

The object of the invention is to provide a solid state switch device employing a simple zero voltage switching control circuit.

According to a broad aspect of the invention there is provided a controlled rectifier device, including a four-layer silicon PNP structure comprising: a first outer layer of P-type conductivity forming an anode; a second outer layer of N-type conductivity forming a cathode; an inner layer of P-type conductivity, a portion of which extends through said second layer for forming a gate beside said cathode; means for electrically isolating said gate from said cathode; at least one emitter region formed by regions of said inner P-type layer protruding through said second layer; and an annular channel surrounding said emitter region for electrically isolating said emitter region from said cathode.

According to a further aspect of the invention, there is provided a method of forming a controlled rectifier device, said device including a four-layer PNPN silicon structure, the outer P and N-type layers forming a cathode and anode of the device comprising: forming a P-type gate region adjacent the cathode N-type region; forming at least one emitter area comprising regions of P-type material protruding through the cathode region; electrically isolating the gate and emitter regions from the cathode by etching channels therebetween; and connecting said at least one emitter region to an isolated device terminal.

It is well known that power thyristors are generally protected against spurious switching by so-called shorted emitters. These are areas within the cathode layer of the device where the underlying p-layer is brought to the surface so that the cathode metal locally short circuits the two layers. Low currents flow across the p-layer to the short and the device stays off. Only if the current across this layer reaches a value at which the voltage drop across it exceeds the binded-in voltage of the emitter junction will the device turn on.

If the shorted areas of the device are isolated, e.g. during the gate channel etch operation, the emitter regions can be connected to a separate terminal so that the short can be made externally by a semiconductor switch.

BRIEF DESCRIPTION OF THE DRAWINGS

Embodiments of the invention will now be described with reference to the accompanying drawing in which.

DESCRIPTION OF THE PREFERRED EMBODIMENT

Figure 1:
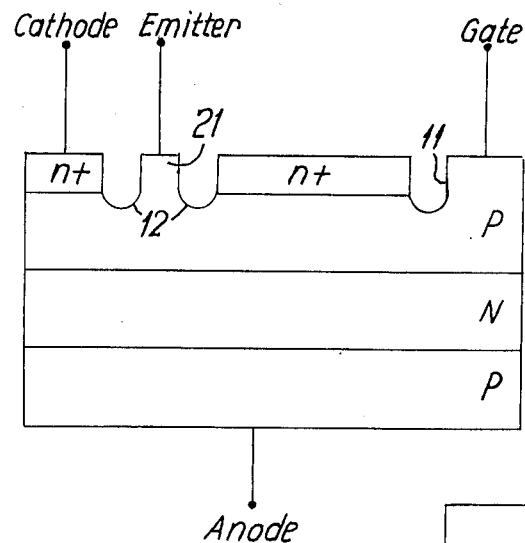
FIGS. 1 and 2 are a cross section and plan view respectively of a controlled rectifier device having an isolated emitter area.
Figure 2:
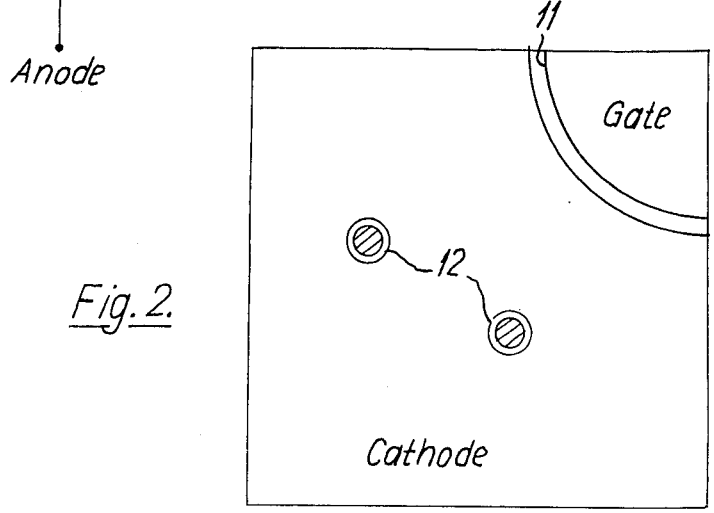

Referring to FIGS. 1 and 2, the device has a four layer silicon PNPN structure, the anods and cathode being formed by one P- and one N- type layer respectively. The other P-type layer is exposed through the cathode surface at one corner of the device to form a gate region which region is isolated from the cathode by an isolating channel 11. P-type regions 21 are formed by areas within the cathode region where the underlying p-type layer is brought to the surface. These P-type regions are electrically isolated from the cathodes each by an annular channel 12 which may be formed during the gate channel etch operation and which may extend below the cathode N-type layer and is connected to a fourth terminal extending from the device through the protective encapsulation (not shown).

Figure 3:
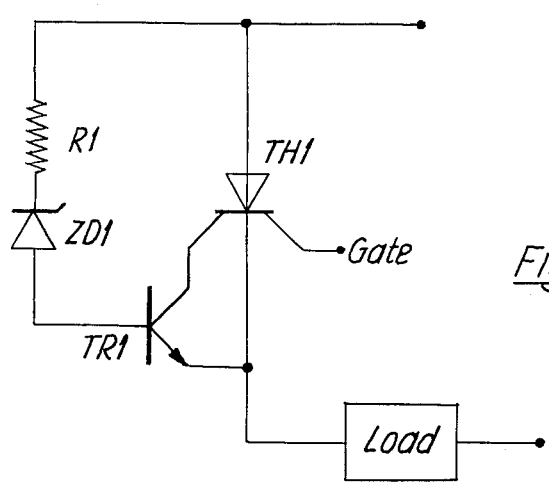
FIG. 3 shows a half wave phase control circuit employing a silicon rectifier device in which the emitter short has been removed.

As shown in FIG. 3, the modified thyristor device TH1 is arranged with a switch device, viz., the transistor TR1 between its emitter and cathode. The base of the transistor TR1 is connected via a Zener diode to a resistor R1 in series with the A.C. power line L. A load is connected in series with the cathode of the tyristor and the gate electrode of the thyristor is triggered in the conventional manner. If the voltage at the junction of the diode and resistor is below the diode breakdown voltage the transistor TR1 remains off and the thyristor TH1 is in a sensitive mode. Under these conditions the thyristor can be turned on while a suitable pulse is applied to its gate. When the diode breakdown voltage is exceeded the transistor TR1 is switched on, thus shorting the emitter of the thyristor TH1 to its cathode and rendering the thyristor insensitive to gate pulses below a maximum value.

In the embodiment described herein the thyristor is shown with two shorted emitter regions. Further shorted emitter regions may of course be employed depending on the construction and intended application of the device, each region being isolated from the device cathode layer.

Figure 4:
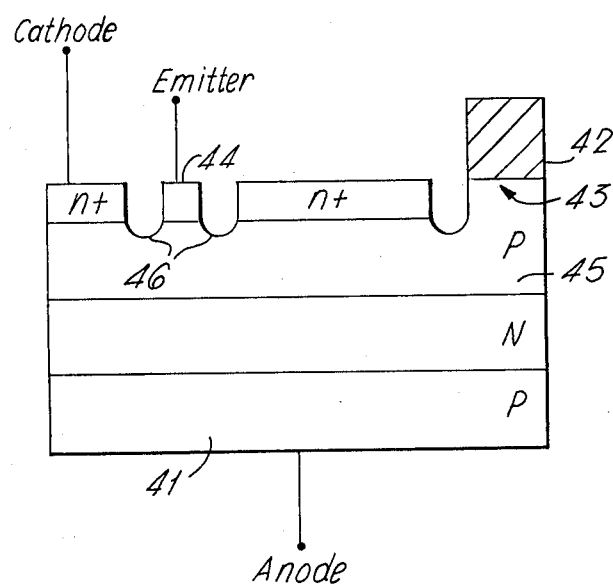
FIG. 4 is a cross section of an optical isolation arrangement employing a device of the type shown in FIGS. 1 and 2.

In the embodiment shown in FIG. 4, the isolated emitter technique is applied to an optical isolation device. the device is prepared from a photo-thyristor 41 on which a light emitting diode 42 is mounted so as to be capable of triggering the thyristor by the emission of a light pulse. As before the thyristor device 41 has a four layer PNPN silicon structure, the outer P and N layers of which form the anode and cathode regions respectively. The light emitting device 42, which may be of the gallium arsenide or phosphide type, is mounted on the gate region 43 of the thyristor in phase of the conventional gate electrode and triggers the thyristor by illuminating the gate region to produce current carriers. P-type regions 44 are formed by areas within the cathode region where the underlying P-type layer 45 is brought through to the surface of the device and are each isolated from the cathode N- layer by an annular channel 44. Shorting of these P-type regions 44 to the cathode of the device can then be effected externally. The light intensity produced by the LED can be adjusted such that the thyristor device turns on when the 'emitter short' is opened but not when it is closed.

While the principles of this invention have been described above in connection with specific apparatus, it is to be understood that this description is made only by way of example and not as a limitation on the scope of the invention as set forth in the objects and features thereof and in the accompanying claims.

What is claimed is:

1. A controlled rectifier device, including a four-layer silicon PNP structure comprising:
   a first outer layer of P-type conductivity forming an anode;
   a second outer layer of N-type conductivity forming a cathode;
   an inner layer of P-type conductivity, a portion of which extends through said second layer for forming a gate beside said cathode;
   means for electrically isolating said gate from said cathode;
   at least one emitter region formed by regions of said inner P-type layer protruding through said second layer; and
   an annular channel surrounding said emitter region for electrically isolating said emitter region from said cathode.

2. A controlled rectifier according to claim 1 further comprising means for optically triggering the device by injecting a light pulse into said gate region.

3. A controlled rectifier according to claim 2 wherein the light injection means includes a gallium arsenide light emitting diode mounted on said gate.

4. A controlled rectifier according to claim 2 wherein said light injection means includes a gallium phosphide light emitting diode mounted on said gate.

5. A method of forming a controlled rectifier device, said device including a four-layer PNPN silicon structure, the outer P and N-type layers forming a cathode and anode of the device comprising:
   forming a P-type gate region adjacent the cathode N-type region;
   forming at least one emitter area comprising regions of P-type material protruding through the cathode region;
   electrically isolating the gate and emitter regions from the cathode by etching channels therebetween; and
   connecting said at least one emitter region to an isolated device terminal.

* * * * *